(12) United States Patent
Su et al.

(10) Patent No.: US 11,133,291 B2
(45) Date of Patent: Sep. 28, 2021

(54) CHIP PACKAGE STRUCTURE WITH MULTI-CHIP STACK

(71) Applicant: POWERTECH TECHNOLOGY INC., Hsinchu County (TW)

(72) Inventors: Chih-Yen Su, Hsinchu County (TW); Chun-Te Lin, Hsinchu County (TW)

(73) Assignee: POWERTECH TECHNOLOGY INC., Hsinchu County (TW)

( * ) Notice: Subject to any disclaimer, the term of this patent is extended or adjusted under 35 U.S.C. 154(b) by 0 days.

(21) Appl. No.: 16/817,656

(22) Filed: Mar. 13, 2020

(65) Prior Publication Data
US 2021/0202444 A1 Jul. 1, 2021

(30) Foreign Application Priority Data
Dec. 31, 2019 (TW) .................................. 108148495

(51) Int. Cl.
*H01L 25/065* (2006.01)
*H01L 23/12* (2006.01)
*H01L 23/538* (2006.01)

(52) U.S. Cl.
CPC .......... *H01L 25/0657* (2013.01); *H01L 23/12* (2013.01); *H01L 23/5384* (2013.01)

(58) Field of Classification Search
CPC combination set(s) only.
See application file for complete search history.

(56) References Cited

U.S. PATENT DOCUMENTS

| | | | |
|---|---|---|---|
| 9,899,362 B2* | 2/2018 | Simion | H01L 23/3157 |
| 10,276,511 B1* | 4/2019 | Tsai | H01L 23/16 |
| 2005/0110128 A1* | 5/2005 | Ahn | H01L 24/48 257/686 |
| 2005/0168961 A1* | 8/2005 | Ono | H05K 1/144 361/784 |
| 2008/0088011 A1 | 4/2008 | Hu | |
| 2009/0051043 A1* | 2/2009 | Wong | H01L 25/0657 257/777 |
| 2011/0079905 A1* | 4/2011 | Sanchez | H01L 25/0657 257/738 |
| 2012/0079228 A1* | 3/2012 | Chen | H03K 21/16 711/167 |
| 2014/0167291 A1* | 6/2014 | Nam | H01L 25/0657 257/777 |
| 2015/0200187 A1* | 7/2015 | Park | H01L 24/49 257/777 |
| 2016/0372446 A1* | 12/2016 | Keser | H01L 24/03 |
| 2017/0179078 A1* | 6/2017 | Jung | H01L 25/50 |
| 2017/0207197 A1* | 7/2017 | Yu | H01L 24/32 |
| 2017/0338175 A1* | 11/2017 | Liu | H01L 24/19 |
| 2018/0167054 A1* | 6/2018 | Berdy | H03H 9/72 |
| 2019/0057932 A1* | 2/2019 | Wu | H01L 23/5226 |
| 2019/0164909 A1 | 5/2019 | Chang Chien | |
| 2019/0214274 A1* | 7/2019 | Auchere | H01L 25/0655 |

(Continued)

*Primary Examiner* — Mamadou L Diallo
(74) *Attorney, Agent, or Firm* — Winston Hsu

(57) ABSTRACT

A chip package structure including a circuit board, a first die, a spacer, and a second die. The first die is disposed on the circuit board, and the spacer is disposed on the circuit board, in which the spacer includes a spacer part and at least one via structure penetrating through the spacer part. The second die is disposed on the first die and the spacer, and the second die is electrically connected to the circuit board through the spacer.

19 Claims, 7 Drawing Sheets

(56) References Cited

U.S. PATENT DOCUMENTS

| | | | |
|---|---|---|---|
| 2019/0229092 A1* | 7/2019 | Ding | H01L 24/81 |
| 2019/0348748 A1* | 11/2019 | Liu | H01L 23/3128 |
| 2020/0075503 A1* | 3/2020 | Chuang | H01L 21/4817 |
| 2020/0168572 A1* | 5/2020 | Lin | H01L 23/66 |
| 2020/0343184 A1* | 10/2020 | Fujishima | H01L 23/5226 |
| 2021/0066254 A1* | 3/2021 | Yu | H01L 21/56 |
| 2021/0080425 A1* | 3/2021 | Bhat | G01N 27/407 |

* cited by examiner

CHIP PACKAGE STRUCTURE WITH MULTI-CHIP STACK

BACKGROUND OF THE INVENTION

1. Field of the Invention

The present invention relates to a chip package structure, and more particularly, to a chip package structure with multi-chip stack.

2. Description of the Prior Art

With miniaturization and multifunction of electronic products, multi-chip package structures are becoming more and more common in many electronic products, in which two or more chips are packaged in one single package structure to shrink overall volume. In common multi-chip package structures, two or more chips are disposed on the same substrate side by side. As the number of the chip is increased, the area of the package structure is accordingly enlarged by disposing chips side by side. For solving this problem, a stacking method is developed to arrange the chips. However, there are many disadvantages exist in the chip stacking method, for example, excessive high thickness of the package structure is occurred by vertically stacking the chips, and the resistance of electrical path from the top chip to the circuit board becomes larger, thereby increasing power consumption.

SUMMARY OF THE INVENTION

According to an embodiment of the present invention, a chip package structure is provided and includes a circuit board, a first die, a spacer, and a second die. The first die is disposed on the circuit board, and the spacer is disposed on the circuit board, in which the spacer includes a spacer part and at least one first via structure, and the first via structure penetrates through the spacer part. The second die is disposed on the first die and the spacer, and the second die is electrically connected to the circuit board through the spacer.

By means of the spacer with the via structure, the length of the bonding wire can be effectively shortened to reduce the resistance of the bonding wire. Therefore, the efficiency of the chip package structure can be improved or the power consumption of the chip package structure can be reduced, and the overall width of the chip package structure can also be reduced.

These and other objectives of the present invention will no doubt become obvious to those of ordinary skill in the art after reading the following detailed description of the preferred embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the display device, and certain elements in various drawings may not be drawn to scale. In addition, the number and dimension of each device shown in drawings are only illustrative and are not intended to limit the scope of the present disclosure.

It will be understood that when an element or layer is referred to as being "on" or "connected to" another element or layer, it can be directly on or directly connected to the other element or layer, or intervening elements or layers may be presented. In contrast, when an element is referred to as being "directly on" or "directly connected to" another element or layer, there are no intervening elements or layers presented.

It should be noted that the technical features in different embodiments described in the following can be replaced, recombined, or mixed with one another to constitute another embodiment without departing from the spirit of the present disclosure.

Figure 1:
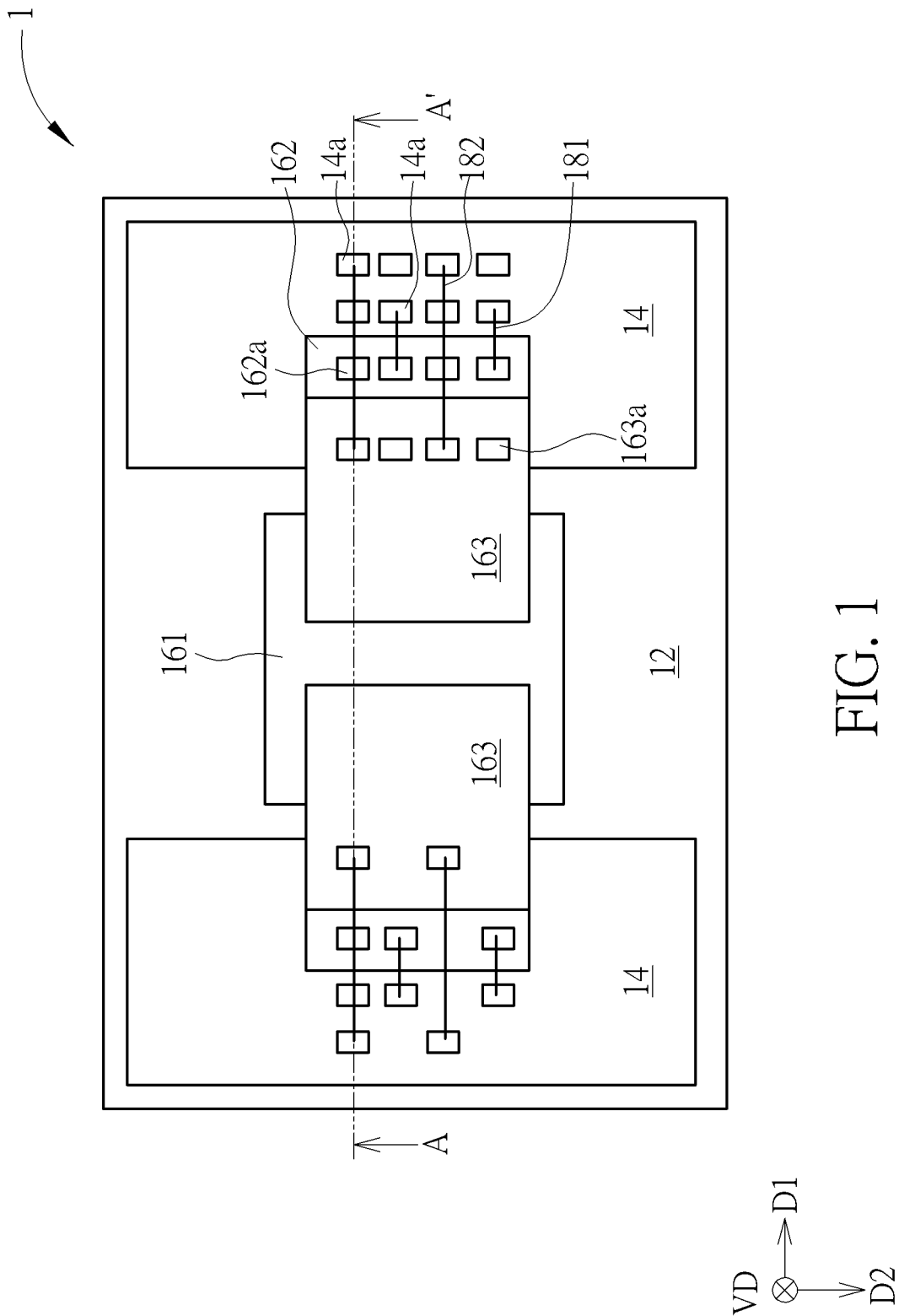
FIG. 1 schematically illustrates a top view of a chip package structure according to a first embodiment.
Figure 2:
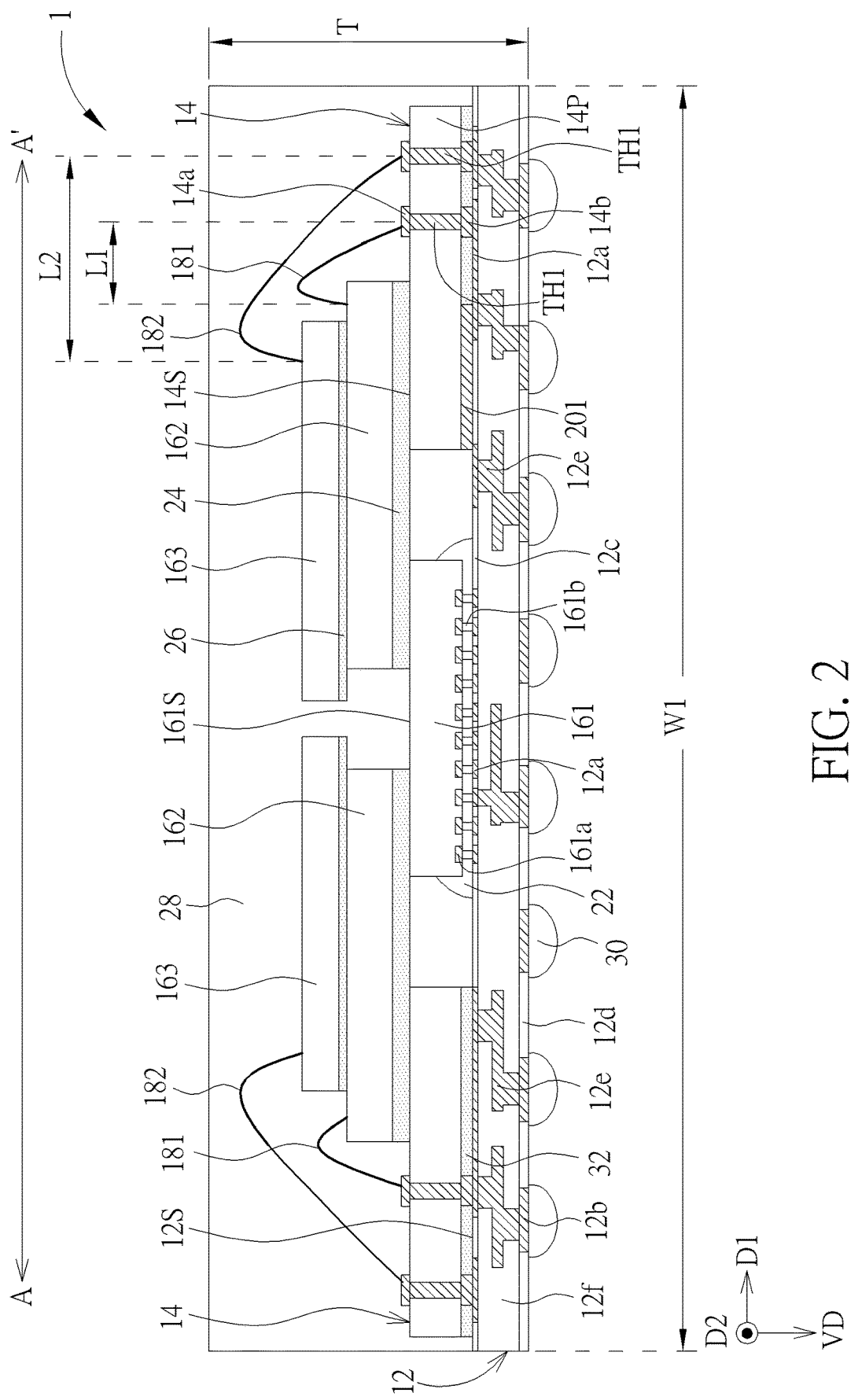
FIG. 2 schematically illustrates a cross-sectional view taken along a line A-A' of FIG. 1.

FIG. 1 schematically illustrates a top view of a chip package structure according to a first embodiment, and FIG. 2 schematically illustrates a cross-sectional view taken along a line A-A' of FIG. 1. The chip package structure 1 includes a circuit board 12, and at least one spacer 14 and at least two dies (such as first die 161 and second die 162) disposed on the circuit board 12, in which one of the dies (such as the first die 161) is disposed on the spacer 14 and another one of the dies (such as the second die 162), and the die disposed on the spacer 14 may be electrically connected to the circuit board 12 through the spacer 14. Accordingly, a width W1 of the chip package structure in a horizontal direction may be shrunk, and/or the thickness T of the chip package structure 1 may be reduced. The horizontal direction may for example be a direction D1 or a direction D2 parallel to a top surface 12S of the circuit board 12 or other direction parallel to the top surface 12S of the circuit board 12 and different from the direction D1 and the direction D2.

The circuit board 12 may for example be a printed circuit board or other type circuit board, but not limited thereto. In some embodiments, the circuit board 12 may for example be the circuit board with wires of a single layer or wires of multi-layer. For example, the circuit board 12 shown in FIG. 2 may include a plurality of top pads 12a, a plurality of bottom pads 12b, a top protection layer 12c, a bottom protection layer 12d, a plurality of interconnects 12e, and an insulation layer 12f. The top protection layer 12c is disposed on the insulation layer 12f and has openings exposing the top pads 12a, the bottom protection layer 12d is disposed under the insulation layer 12f and has openings exposing the bottom pads 12b, and the interconnects 12e penetrate through the insulation layer 12f, such that the top pads 12a may be electrically connected to the corresponding bottom pads 12b through the corresponding interconnects 12e. The top surface 12S may for example be an outer surface of the top protection layer 12c, but not limited thereto. The circuit board 12 of the present invention is not limited herein, and the structure of the circuit board 12 may be adjusted according to the requirements.

As shown in FIG. 1 and FIG. 2, the first die 161 may be bonded and electrically connected to the circuit board 12, for example by a flip chip method. For instance, the first die 161 may include conductive bumps 161b disposed on the bottom surface of the first die 161, and the first die 161 is bonded to the top pads 12a of the circuit board 12 through the conductive bumps 161b. In some embodiments, the electrical connection method between the first die 161 and the circuit board 12 is not limited to be the flip chip bonding method, and may be a wire bonding method. In some embodiments, a under fill 22 may be further disposed between the first die 161 and the circuit board 12 and used for enhancing bonding reliability between the first die 161 and the circuit board 12. In this embodiment, an adhesive layer 24 may be further disposed under the second die 162 and used for sticking the second die 162 to the first die 161 and the spacer 14. Also, the second die 162 may be electrically connected to the spacer 14 through the wire bonding method.

The die of the present invention may for example be an application specific integrated circuit (ASIC) chip, memory chip or other type chip, but not limited thereto. The memory chip may for example be flash memory chip or other type of memory chip, but not limited thereto. Different dies may have the same function or different functions. The die may also be known as semiconductor die, chip or integrated circuit die. In one embodiment, the first die 161 and the second die 162 may have different functions. For example, the second die 162 may be the memory chip, and the first die 161 may be the ASIC chip for controlling or driving the memory chip. In such situation, the first die 161 may have more input/output pads 161a, so the first die 161 may be bonded to the circuit board 12 by the flip chip method; and the second die 162 may have less input/output pads 162a, so the second die 162 may be electrically connected to the spacer 14 by the wire bonding method. For instance, the number of the input/output pads 161a of the first die 161 may be greater than the number of the input/output pads 162a of the second die 162, but not limited thereto. In some embodiments, the first die 161 and the second die 162 may have the same function, for example, both are memory chips. In such situation, the first chip 161 may be electrically connected to the circuit board 12 by the wire bonding method, and the second chip 162 may be electrically connected to the spacer 14 through the wire bonding method.

The spacer 14 and the first die 161 are disposed on the circuit board 12 side by side, such that the spacer 14 and the first die 161 may be used for supporting the second die 162. For example, the spacer 14 may be adhered to the circuit board 12 through the adhesive layer 32. In this embodiment, the spacer 14 may include a spacer part 14P and at least one first via structure TH1, and the first via structure TH1 penetrates through the spacer part 14P. The spacer part 14P may for example include semiconductor material, polymer material or other suitable supporting material, but not limited thereto. In the embodiment shown in FIG. 2, the spacer 14 may include a plurality of first via structures TH1 vertically penetrating through the spacer part 14P, and the spacer 14 may further include a plurality of top pads 14a and a plurality of bottom pads 14b. The top pads 14a are disposed on the spacer part 14P and connected to the corresponding first via structures TH1, and the bottom pads14b are disposed under the spacer part 14P and connected to the corresponding first via structure TH1, such that the top pads 14a may be electrically connected to the corresponding bottom pads 14b through the corresponding first via structures TH1. The bottom pad 14b may be electrically connected to the corresponding top pad 12a of the circuit board 12. For example, the first via structure TH1 penetrates through the spacer part 14P, such that the top pad 14a overlaps the bottom pad 14b in the top view direction VD. The spacer 14 may further include a connecting element 201 for electrically connecting the bottom pad 14b to the top pad 12a of the circuit board 12. In one embodiment, the top pad 12a of the circuit board 12 may not overlap the bottom pad 14b of the spacer 14 in the top view direction VD, so that at least one top pad 12a of the circuit board 12 may not overlap at least one first via structure TH1 to which the top pad 12a is connected in the top view direction VD of the chip package structure 1, but not limited thereto. In the embodiment shown in FIG. 2, the connecting element 201 may for example be a single conductive layer, which may for example include metal or other suitable conductive material. Although the connecting element 201 illustrated in FIG. 2 is not connected to the bottom pad 14b, the connecting element 201 actually may be connected to the bottom pad 14b at other places, so that the bottom pad 14b may be electrically connected to the corresponding top pad 12a through the connecting element 201. The bottom pad 14b and the connecting element 201 may be formed of the same conductive layer or different conductive layers. The conductive layer may for example include metal or other suitable conductive material, but not limited thereto. In some embodiments, the connecting element 201 may for example include redistribution layer, but not limited thereto. It is noted that in order to reduce the tilt of the second die 162 disposed on the spacer 14 and the first die 161, a height of the top surface 14S of the spacer part 14P of the spacer 14 may be substantially level with the top surface 161S of the first die 161. For example, a distance between the top surface 14S of the spacer part 14P and the top surface 12S of the circuit board 12 and a distance between the top surface 161S of the first die 161 and the top surface 12S of the circuit board 12 may be substantially the same.

As shown in FIG. 2, in one embodiment, the chip package structure 1 may include at least one first bonding wire 181 extending from the second die 162 (such as the input/output pad 162a of the second die 162 shown in FIG. 1) to the spacer 14 (such as the top pad 14a of the spacer 14), such that the second die 162 may be electrically connected to the top pad 14a, the first via structure TH1 and the bottom pad 14b of the spacer 14 through the first bonding wire 181, thereby being electrically connected to the circuit board 12 through the spacer 14. In one embodiment, an end of the first bonding wire 181 may be directly bonded to the input/output pad 162a of the second die 162, and another end of the first bonding wire 181 may be directly bonded to the top pad 14a of the spacer 14, but the present invention is not limited thereto. It is noted that since the height of the top pad 14a of the spacer 14 is higher than the height of the top pad 12a of the circuit board 12, the length of the first bonding wire 181 may be shortened to reduce the resistance of the first bonding wire 181. In addition, the resistance of the first via structure TH1 of the spacer 14 may be less than the resistance of the first bonding wire 181, so the resistance from the second die 162 to the circuit board 12 can be significantly reduced by decreasing the resistance of the first bonding wire 181, thereby improving the efficiency of the chip package structure 1 or reducing the power consumption of the chip package structure 1. Furthermore, since the length L1 of the first bonding wire 181 projected onto the horizontal direction is shrunk, the overall width W1 of the chip package structure 1 in the horizontal direction may be reduced.

In some embodiments, as shown in FIG. 1 and FIG. 2, the chip package structure 1 may further include a third die 163, another adhesive layer 26, and at least one second bonding wire 182. It is noted that although the cross-section view of FIG. 2 illustrates the first bonding wire 181 and the second bonding wire 182 together, the first bonding wire 181 and the second bonding wire 182 may be located in different cross-sectional views. The third die 162 is adhered to the second die 162 through the adhesive layer 26, and the second bonding wire 182 extends from the input/output pad 163a (top surface of the third die 163) of the third die 163 to the top pad 14a of the spacer 14, so as to electrically connecting the third die 163 to the first via structure TH1 of the spacer 14. Accordingly, the third die 163 may be electrically connected to the circuit board 12 through the second bonding wire 182 and the spacer 14. In one embodiment, an end of the second bonding wire 182 may be directly bonded to the input/output pad 163a of the third die 163, and another end of the second bonding wire 182 may be directly bonded to the corresponding top pad 14a of the spacer 14, but the present invention is not limited thereto. It should be noted that, the third die 163 and the second die 162 may be electrically connected to different top pads 14a of the spacer 14 that are electrically insulated from each other, so as to transfer different signals. In some embodiments, when one of the input/output pad 163a of the third die 163 and one of the input/output pad 162a of the second die 162 transfer the same signal, the input/output pad 163a and the corresponding input/output pad 162a may electrically connected to the same top pad 14a or the top pads 14a that are electrically connected. It is noted that because of the disposition of the spacer 14, the length of the second bonding wire 182 may be shortened to reduce the resistance of the second bonding wire 182 and improve the efficiency of the chip package structure 1 or reduce the power consumption of the chip package structure 1. In addition, because the disposition of the spacer 14 reduces the height difference between two ends of the second bonding wire 182, the height of a part of the second bonding wire 182 higher than third die 163 can be reduced, thereby shortening the length L2 of the second bonding wire 182 projected onto the horizontal direction and decreasing the total width of the chip package structure 1 in the horizontal direction. In some embodiments, the third die 163 and the second die 162 may have the same function, for example both are memory chips. The adhesive layers 24, 26, 32 may for example include die attach film (DAF) or other suitable insulating adhesive material.

In some embodiments, the chip package structure 1 may include a plurality of spacers 14, a plurality of second dies 162, and a plurality of third dies 163. In the embodiment of the chip package structure 1 shown in FIG. 1 and FIG. 2, the number of the spacer 14, the number of the second die 162 and the number of the third die 163 are respectively two for an example, but not limited thereto. In some embodiments, the spacers 14 may be disposed at two sides of the first die 161 respectively, for example, the first via structures TH1 of the spacer 14 may be located at outer sides of the stacked dies, but not limited thereto. The second dies 162 not only be respectively disposed on the corresponding spacers 14, but also be stacked on the same first die 161, and the third dies 163 may be disposed on the corresponding second dies 162 respectively, such that the second dies 162 and the third dies 163 may be electrically connected to the circuit board 12 through the corresponding spacers 14, thereby reducing the resistances of the first bonding wires 181 and the second bonding wires 182. In some embodiments, the spacers 14 may have similar or the same structure, the second dies 162 may have similar or the same functions, and the third dies 163 may have similar or the same function, but not limited thereto.

In some embodiments, the chip package structure 1 may further include an encapsulation 28 disposed on the first die 161, the second dies 162, the third dies 163, the first bonding wires 181, the second bonding wires 182, and the spacers 14, and the encapsulation 28 seal them on the circuit board 12, so as to protect the dies, bonding wires and the spacers 14. In some embodiments, the chip package structure 1 may further include a plurality of conductive balls 30 respectively disposed on the bottom pads 12b of the circuit board 12, such that the chip package structure 1 may further be disposed on and electrically connected to other device, carrier or circuit board.

The chip package structure of the present invention is not limited to the above-mentioned embodiments, and other embodiments of the present invention are further detailed in the following description. In order to simplify the description, the element of different embodiments and the same element of the first embodiment will use the same label. The following contents would focus on the difference between different embodiments and the first embodiment, and the repeated portion will not be redundantly described.

Figure 3:
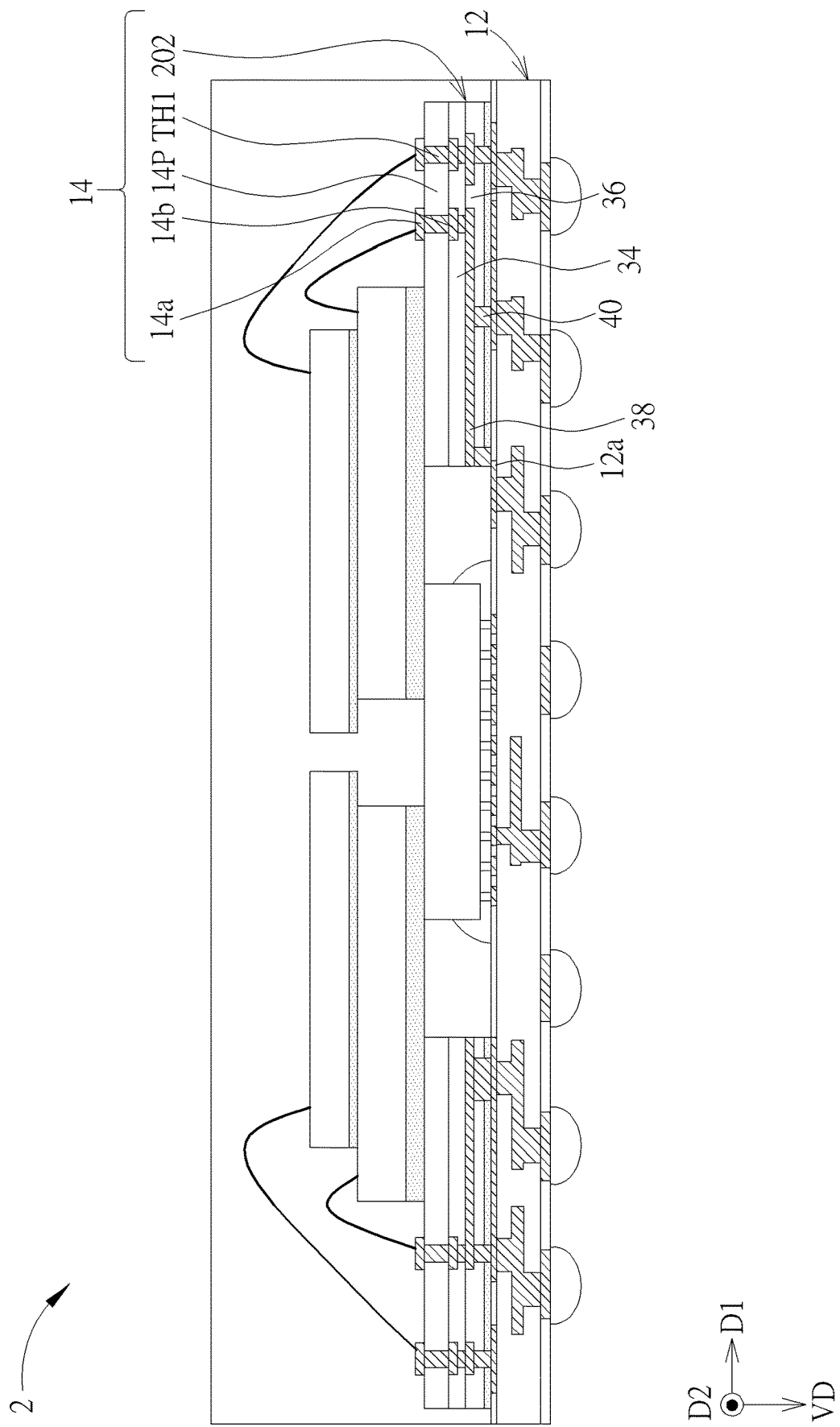
FIG. 3 schematically illustrates a cross-sectional view of a chip package structure according to a second embodiment of the present invention.

FIG. 3 schematically illustrates a cross-sectional view of a chip package structure according to a second embodiment of the present invention. The chip package structure 2 of this embodiment is different from the previous embodiment in that the connecting element 202 may include a redistribution layer formed on the bottom surface of the spacer part 14P and the bottom pads 14b. In the embodiment shown in FIG. 3, the redistribution layer may include two dielectric layers 34, 36 and a conductive layer 38, in which the conductive layer 38 is disposed between the dielectric layers 34, 36, and the dielectric layer 34 may have at least one opening, such that the conductive layer 38 may be electrically connected to at least one of the bottom pads 14b through the opening of the dielectric layer 34. Additionally, the dielectric layer 36 may have at least one opening corresponding to the top pad 12a of the circuit board 12, such that the conductive layer 38 may be electrically connected to the circuit board 12 through the conductive bump 40. In some embodiments, the redistribution layer may include three or more dielectric layers and two or more conductive layers.

Figure 4:
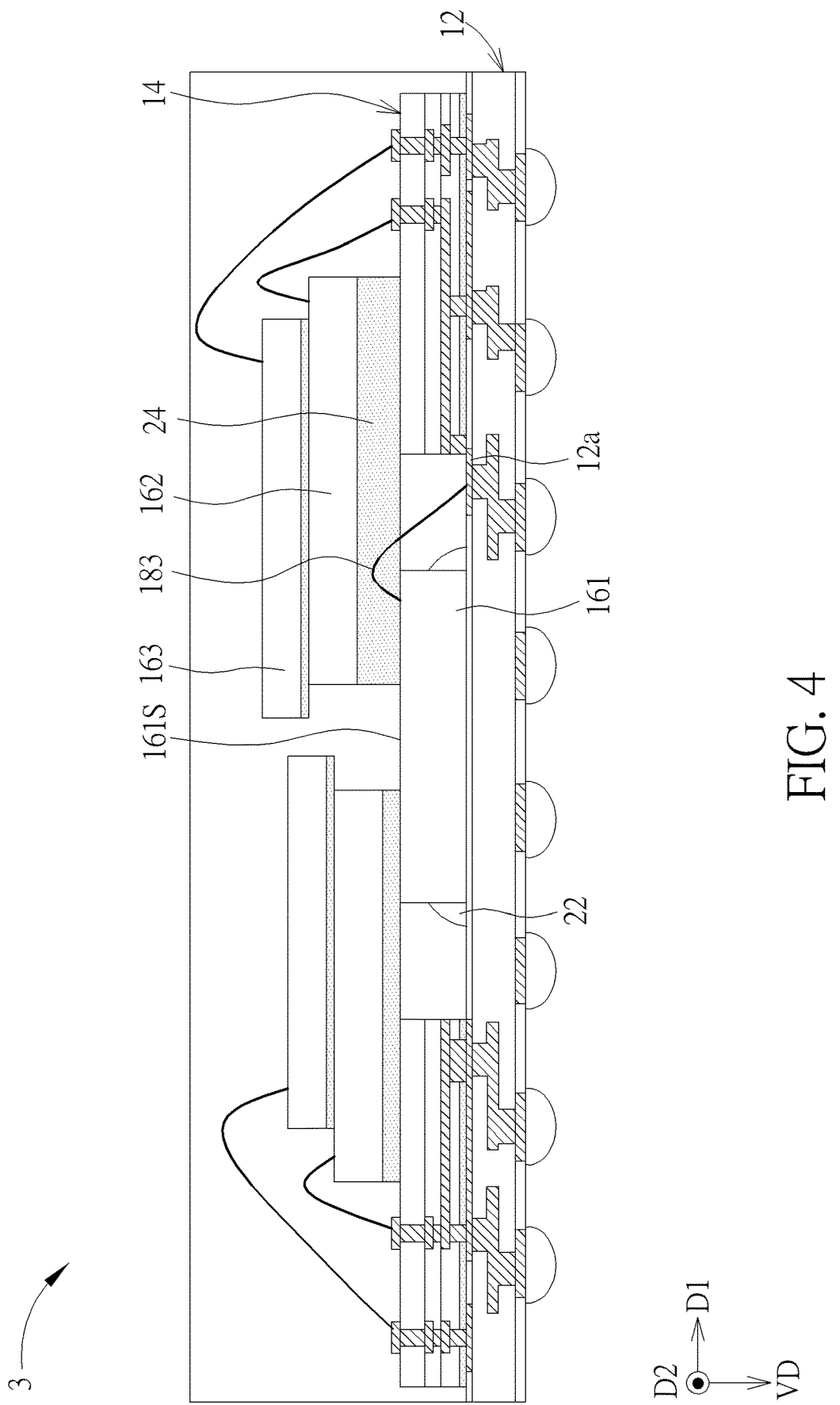
FIG. 4 schematically illustrates a cross-sectional view of a chip package structure according to a third embodiment of the present invention.

FIG. 4 schematically illustrates a cross-sectional view of a chip package structure according to a third embodiment of the present invention. The chip package structure 3 of this embodiment is different from the previous embodiment in that the chip package structure 3 may further include at least one third bonding wire 183 extending from the top surface 161S of the first die 161 to one of the top pads 12a of the circuit board 12, such that the first die 161 may be electrically connected to the circuit board 12 through the third bonding wire 183. For example, the first die 161 may have less pads, so the pads are disposed on the top surface 161S of the first die 161. The first die 161 and the second die 162 may for example have the same function, for example they are both the memory chips. In some embodiments, the number of the third bonding wire 183 is not limited to be shown in FIG. 3 and may be plural. It is noted that in order to reduce the damage of the third bonding wire 183 due to the disposition of the second die 162, the thickness of the adhesive layer 24 used to stick the second die 162 to the first die 161 should be greater than the height of a part of the third bonding wire 183 on the top surface 161S of the first die 161. In some embodiments, the chip package structure 3 may adopt the embodiment shown in FIG. 2, the embodiment shown in FIG. 3 or the content of the combination thereof.

Figure 5:
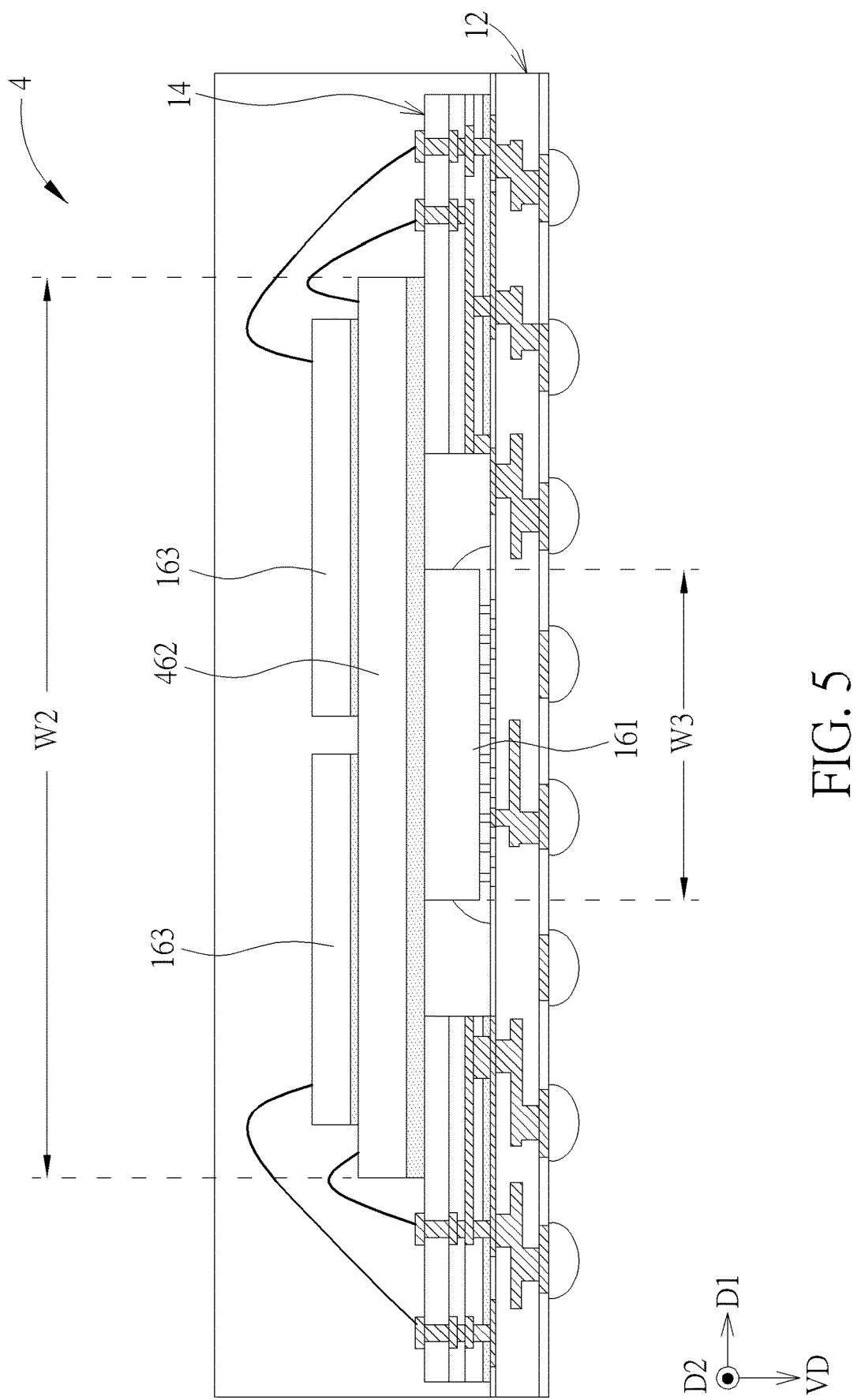
FIG. 5 schematically illustrates a cross-sectional view of a chip package structure according to a fourth embodiment of the present invention.

FIG. 5 schematically illustrates a cross-sectional view of a chip package structure according to a fourth embodiment of the present invention. The chip package structure 4 of this embodiment is different from the previous embodiment in that in the horizontal direction (e.g. the direction D1), the width W2 of the second die 462 is greater than the width W3 of the first die 161. In some embodiments, the area of the second die 462 is greater than the area of the first die 161 but is not limited thereto. In the embodiment shown in FIG. 5, the chip package structure 4 may only include a single second die 462 disposed on the first die 161 and two spacers 14, and the third dies 163 are disposed on the second die 462, but the present invention is not limited thereto. In some embodiments, the area of the second die 462 may be adjusted according to the requirements and may be stacked on the first die 161 and at least one spacer 14. In some embodiments, the chip package structure 4 may adopt the embodiment shown in FIG. 2, the embodiment shown in FIG. 3, the embodiment shown in FIG. 4 or the content of the combination of at least two thereof.

Figure 6:
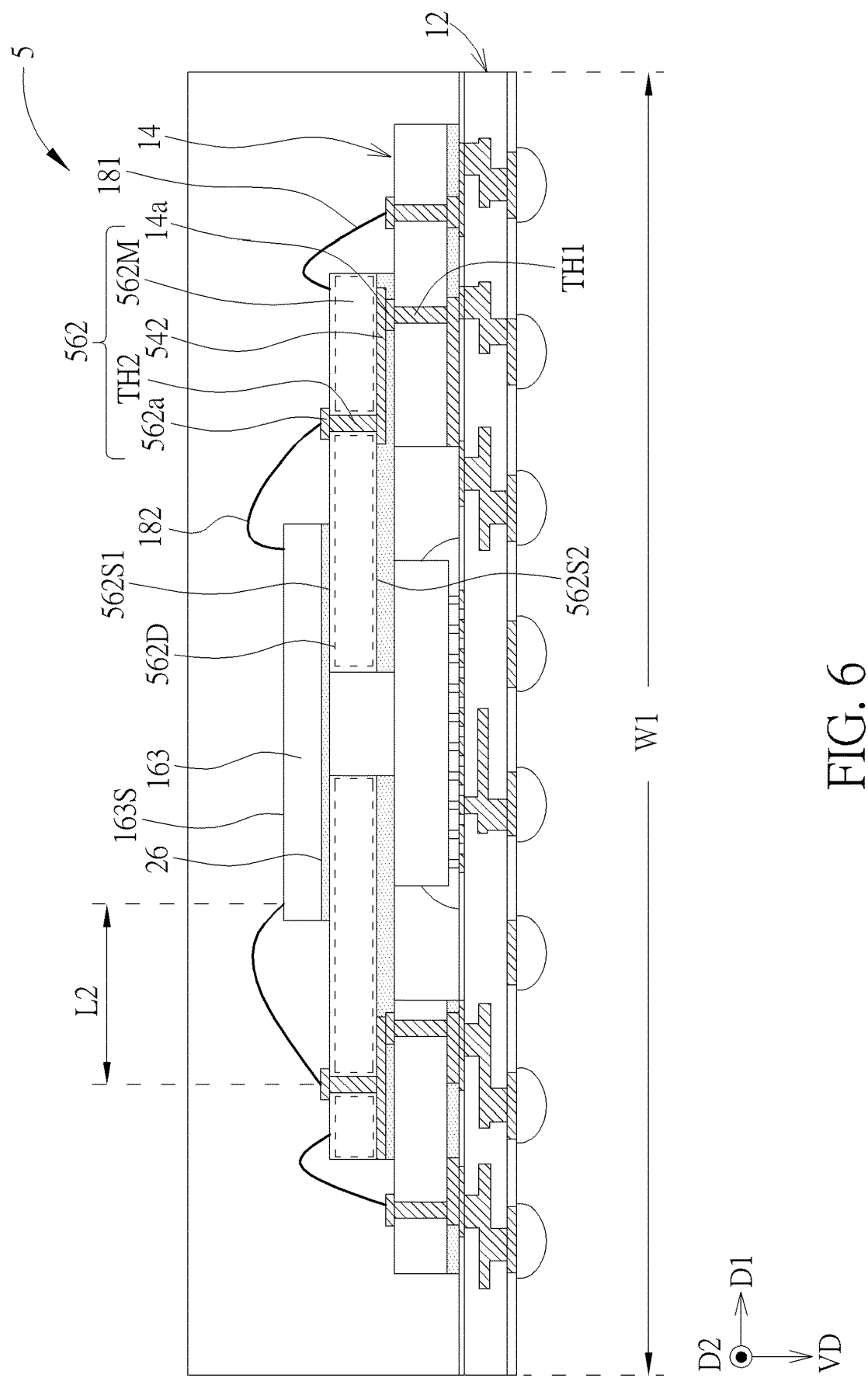
FIG. 6 schematically illustrates a cross-sectional view of a chip package structure according to a fifth embodiment of the present invention.

FIG. 6 schematically illustrates a cross-sectional view of a chip package structure according to a fifth embodiment of the present invention. The chip package structure 5 of this embodiment is different from the previous embodiment in that at least one second die 562 may further include a die body 562M, at least one second via structure TH2, and a pad 562a disposed on the die body 562M and the second via structure TH2. The second via structure TH2 penetrates through the die body 562M and extends from the top surface 562S1 of the die body 562M to the bottom surface 562S2 of the die body 562M, and the second bonding wire 182 extends from the top surface 163S of the third die 163 to the pad 562a of the second die 562. In one embodiment, in the top view direction VD, the second via structure TH2 may overlap the pad 562a so as to be electrically connected to the pad 562a. Furthermore, the second die 562 may further include the connecting element 542 disposed on the bottom surface 562S2 of the die body 562M and electrically connected to the second via structure TH2. Through the connecting element 542 and the second via structure TH2, the pad 562a of the second die 562 electrically connected to the second bonding wire 182 may be electrically connected to the top pad 14a of the spacer 14. In one embodiment, one of the first via structures TH1 of the spacer 14 electrically connected to the second via structure TH2 overlap the second die 562 in the top view direction VD, such that the connecting element 542 may be electrically connected to the one of the first via structures TH1 through the top pad 14a of the spacer 14. In one embodiment, the first via structure TH1 and the second via structure TH2 electrically connected to each other may overlap or may not overlap in the top view direction VD. It should be noted that the pad 562a and the second via structure TH2 is electrically insulated from the device 562D in the die body 562M; that is, the pad 562a is different from and electrically insulated from the input/output pads 162a (as shown in FIG. 1) of the second die 562 that are used to input signals to the device 562D or output the signals from the device 562D. Besides, the input/output pad 162a (as shown in FIG. 1) of the second die 562 may still be electrically connected to the spacer 14 through the first bonding wire 181. In the embodiment shown in FIG. 6, the connecting element 542 may for example be a single conductive layer, but not limited thereto. The conductive layer may for example include metal or other suitable conductive material, but not limited thereto. In some embodiments, the chip package structure 5 may just include a single third die 163 disposed on at least two second die 562 through the adhesive layer 26. In some embodiments, the chip package structure 5 may adopt the embodiment shown in FIG. 2, the embodiment shown in FIG. 3, the embodiment shown in FIG. 4, the embodiment shown in FIG. 5 or the content of the combination of at least two thereof.

It is worthy noted that by means of the disposition of the second via structure TH2, the second bonding wire 182 just needs to extend from the top surface 163S of the third die 163 to the pad 562a of the second die 562 instead of extending to the spacer 14 under the second die 562, so the length of the second bonding wire 182 can be reduced. For example, the length L2 of the second bonding wire 182 projected on the horizontal direction (e.g. the direction D1) is shortened, or the height of the part of the second bonding wire 182 on the top surface 163S of the third die 163 is reduced. Therefore, the efficiency of the chip package structure 5 can be improved or the power consumption of the chip package structure 5 can be reduced, and the overall width W1 of the chip package structure 5 can also be reduced.

Figure 7:
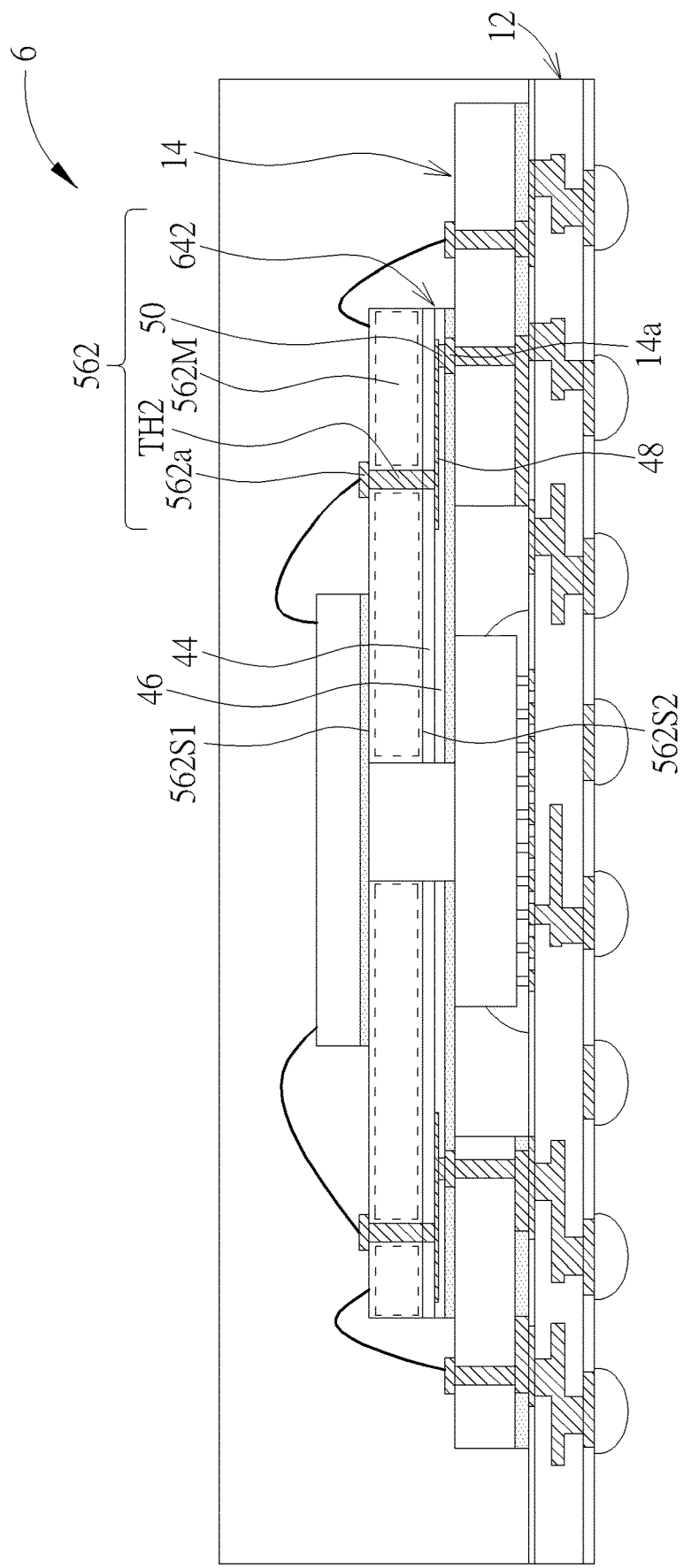
FIG. 7 schematically illustrates a cross-sectional view of a chip package structure according to a sixth embodiment of the present invention.

FIG. 7 schematically illustrates a cross-sectional view of a chip package structure according to a sixth embodiment of the present invention. The chip package structure 6 of this embodiment is different from the previous embodiment in that the connecting element 642 may include a redistribution layer formed on the bottom surface 562S2 of the die body 562M. In the embodiment shown in FIG. 7, the redistribution layer may include two dielectric layers 44, 46 and a conductive layer 48, in which the conductive layer 48 is disposed between the dielectric layers 44, 46, and the dielectric layer 44 may have at least one opening, such that the conductive layer 48 may be electrically connected to the second via structure TH2 through the opening of the dielectric layer 44. Additionally, the dielectric layer 46 may have at least one opening corresponding to the top pad 14a of the spacer 14, such that the conductive layer 48 may be electrically connected to the spacer 14 through the conductive bump 50, thereby being electrically connected to the circuit board 12. In some embodiments, the redistribution layer may include three or more dielectric layers and two or more conductive layers. The conductive layer may for example include metal or other suitable conductive material, but not limited thereto. In some embodiments, the chip package structure 6 may adopt the embodiment shown in FIG. 2, the embodiment shown in FIG. 3, the embodiment shown in FIG. 4, the embodiment shown in FIG. 5 or the content of the combination of at least two thereof.

In summary, in the chip package structure of the present invention, by means of the spacer with the via structure or the die with the via structure, the length of the bonding wire can be effectively shortened to reduce the resistance of the bonding wire. Therefore, the efficiency of the chip package structure can be improved or the power consumption of the chip package structure can be reduced, and the overall width of the chip package structure can also be reduced.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A chip package structure, comprising:
   a circuit board;
   a first die disposed on the circuit board;
   a spacer disposed on the circuit board, wherein the spacer comprises a spacer part and at least one first via structure, and the at least one first via structure penetrates through the spacer part; and
   a second die disposed on the first die and the spacer, and the second die being electrically connected to the circuit board through the spacer,
   wherein the circuit board comprises at least one top pad electrically connected to the at least one first via structure, and the at least one top pad do not overlap the at least one first via structure in a top view direction of the chip package structure.

2. The chip package structure according to claim 1, further comprising at least one first bonding wire extending from a top surface of the second die to the spacer, and the second die being electrically connected to the at least one first via structure through the at least one first bonding wire.

3. The chip package structure according to claim 1, wherein the first die is bonded to the circuit board by a flip chip method.

4. The chip package structure according to claim 2, wherein the first die and the second die have different functions.

5. The chip package structure according to claim 1, wherein the spacer further comprises a connecting element disposed between the spacer part and the circuit board.

6. The chip package structure according to claim 1, wherein an area of the second die is greater than an area of the first die.

7. The chip package structure according to claim 1, further comprising a third die and at least one second bonding wire, wherein the third die is disposed on the second die, and the at least one second bonding wire is bonded to a top surface of the third die.

8. The chip package structure according to claim 7, wherein the at least one second bonding wire extends from the top surface of the third die to the spacer, and the third die is electrically connected to the spacer through the at least one second bonding wire.

9. The chip package structure according to claim 7, wherein the second die comprises a die body and at least one second via structure extending from a top surface of the die body to a bottom surface of the die body, and the third die is electrically connected to the spacer through the at least one second bonding wire and the at least one second via structure.

10. The chip package structure according to claim 9, wherein the die body comprises a device electrically insulated from the at least one second via structure.

11. The chip package structure according to claim 9, wherein the second die further comprises a pad disposed on the die body and electrically connected to the second via structure.

12. The chip package structure according to claim 11, wherein the spacer further comprises a top pad, and the pad of the second die is electrically connected to the top pad of the spacer.

13. The chip package structure according to claim 12, wherein the second die further comprises a connecting element for electrically connecting the pad of the second die to the top pad of the spacer.

14. The chip package structure according to claim 11, wherein the second die further comprises a plurality of input/output pads electrically insulated from the pad.

15. The chip package structure according to claim 9, wherein the at least one first via structure comprises a plurality of first via structures, and one of the plurality of first via structures is electrically connected to the at least one second via structure and overlap the second die.

16. The chip package structure according to claim 7, wherein the third die and the second die have a same function.

17. The chip package structure according to claim 1, further comprising at least one third bonding wire extending from a top surface of the first die to the circuit board, and the first die being electrically connected to the circuit board through the at least one third bonding wire.

18. The chip package structure according to claim 16, wherein the first die and the second die have a same function.

19. The chip package structure according to claim 1, wherein the second die is a memory chip, and the first die is an application specific integrated circuit (ASIC) chip for controlling the memory chip.

* * * * *